United States Patent
Zeng et al.

(10) Patent No.: US 8,958,243 B2
(45) Date of Patent: Feb. 17, 2015

(54) GROUP CLASSIFICATION METHOD FOR SOLID STATE STORAGE DEVICE

(71) Applicant: Lite-On IT Corporation, Taipei (TW)

(72) Inventors: Shih-Jia Zeng, Hsinchu (TW); Jen-Chien Fu, Hsinchu (TW); Yu-Shan Wu, Hsinchu (TW); Hsie-Chia Chang, Hsinchu (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 14/040,832

(22) Filed: Sep. 30, 2013

(65) Prior Publication Data
US 2014/0313822 A1 Oct. 23, 2014

(30) Foreign Application Priority Data
Apr. 19, 2013 (CN) .......................... 2013 1 0137889

(51) Int. Cl.
*G11C 16/04* (2006.01)
*G11C 16/34* (2006.01)

(52) U.S. Cl.
CPC ........ *G11C 16/3427* (2013.01); *G11C 16/3431* (2013.01); *G11C 16/3422* (2013.01)
USPC ............. 365/185.02; 365/185.03; 365/185.24

(58) Field of Classification Search
CPC .................................................. G11C 16/3422
USPC ..................................................... 365/185.02
See application file for complete search history.

(56) References Cited

U.S. PATENT DOCUMENTS

| | | | |
|---|---|---|---|
| 7,898,863 B2 * | 3/2011 | Aritome ................... | 365/185.18 |
| 8,493,791 B2 * | 7/2013 | Karakulak et al. ....... | 365/185.18 |
| 8,587,997 B2 * | 11/2013 | Kim et al. ................ | 365/185.02 |
| 8,817,535 B1 * | 8/2014 | Yang et al. ............... | 365/185.03 |
| 2010/0037007 A1 * | 2/2010 | Futatsuyama et al. ........ | 711/103 |
| 2012/0320676 A1 * | 12/2012 | Lee et al. ................. | 365/185.09 |
| 2013/0163328 A1 * | 6/2013 | Karakulak et al. ......... | 365/185.2 |
| 2014/0119113 A1 * | 5/2014 | Xia et al. ................. | 365/185.03 |
| 2014/0133225 A1 * | 5/2014 | Zeng et al. ............... | 365/185.03 |

* cited by examiner

*Primary Examiner* — Son Mai
(74) *Attorney, Agent, or Firm* — WPAT, PC; Justin King

(57) ABSTRACT

A group classification method includes the following steps. Firstly, a voltage shift parameter table is established. The voltage shift parameter table includes a first positional parameter table corresponding to a first neighboring cell. Then, $M^N$ ICI patterns are determined according to N neighboring cells having a significant ICI effect. If the central cell has a first storing state, $M^N$ central cell threshold voltage shifts corresponding to the $M^N$ ICI patterns are determined according to the voltage shift parameter table, and the first storing state is divided into plural sub-regions. Afterwards, the central cells corresponding to a first number of ICI patterns are classified into a first group of the first storing state. The central cell threshold voltage shifts corresponding to the first number of ICI patterns lie in a first sub-region of the first storing state.

10 Claims, 11 Drawing Sheets

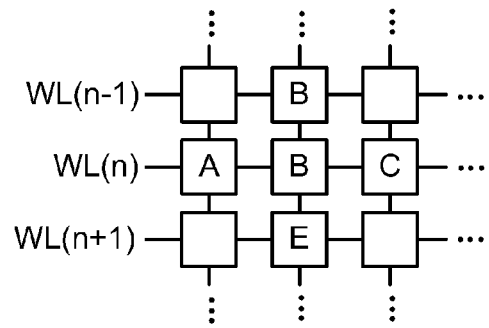
FIG. 3
Central cell: storing state A
| ICI pattern | 1 | 2 | 3 | 4 | 5 | 6 | 7 | 8 | 9 | 10 | 11 | 12 | 13 |
|---|---|---|---|---|---|---|---|---|---|---|---|---|---|
| $V_{TH}$ | V1 | V2 | V3 | V4 | V5 | V6 | V7 | V8 | V9 | V10 | V11 | V12 | V13 |
| ⋮ | | | | | | | | | | | | | |
| ICI pattern | 52 | 53 | 54 | 55 | 56 | 57 | 58 | 59 | 60 | 61 | 62 | 63 | 64 |
| $V_{TH}$ | V52 | V53 | V54 | V55 | V56 | V57 | V58 | V59 | V60 | V61 | V62 | V63 | V64 |
FIG. 4A
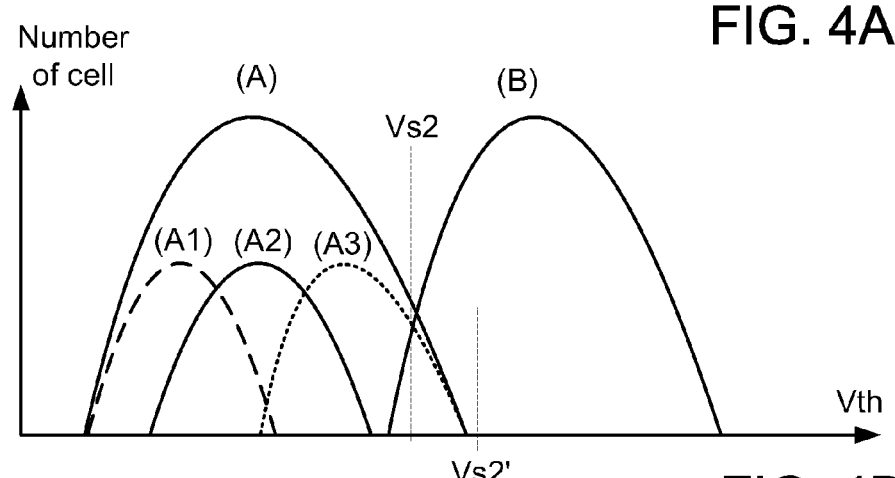
FIG. 4B

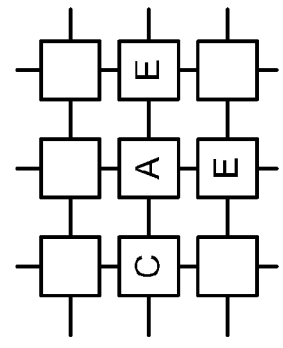
FIG. 5A
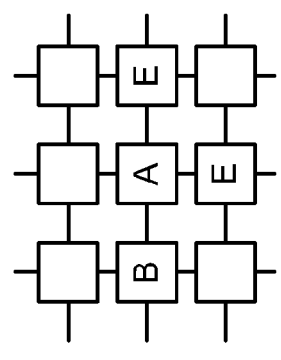
FIG. 5B
FIG. 5C
FIG. 5D
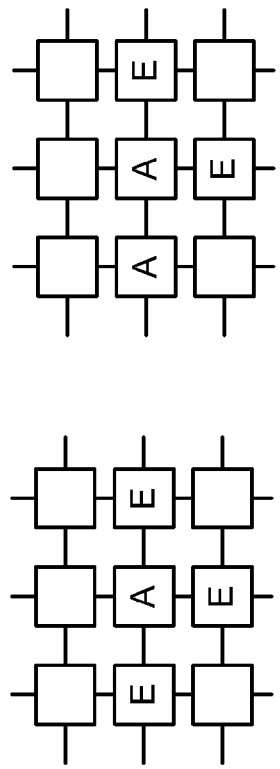
FIG. 5E
| Left parameter table | Storing state of the left cell | | |
|---|---|---|---|
| | A | B | C |
| A | $\Delta V_{A\_LEA}$ | $\Delta V_{A\_LEB}$ | $\Delta V_{A\_LEC}$ |
| B | | | |
| C | | | |
Storing state of the central cell

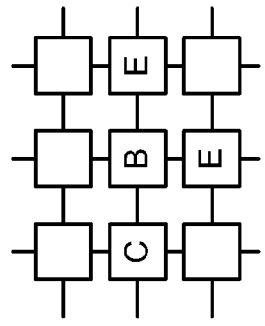
FIG. 6D
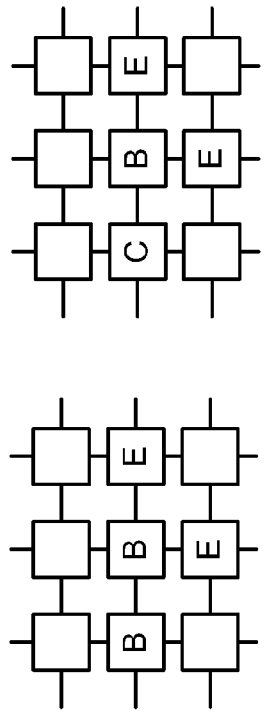
FIG. 6C
FIG. 6E
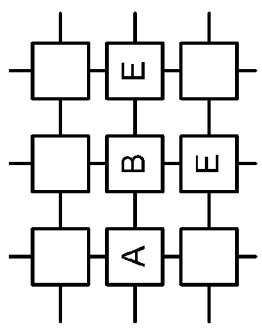
FIG. 6B
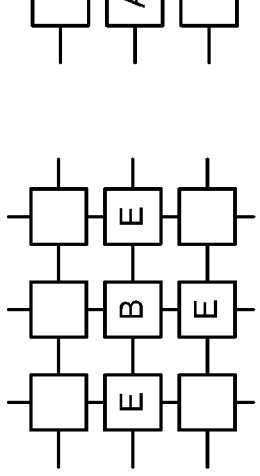
FIG. 6A
| Left parameter table | A | B | C |
|---|---|---|---|
| A | $\Delta V_{A\_LEA}$ | $\Delta V_{A\_LEB}$ | $\Delta V_{A\_LEC}$ |
| B | $\Delta V_{B\_LEA}$ | $\Delta V_{B\_LEB}$ | $\Delta V_{B\_LEC}$ |
| C | | | |
Storing state of the left cell
Storing state of the central cell

| Left parameter table | Storing state of the left cell | | |
|---|---|---|---|
| Storing state of the central cell | A | B | C |
| A | $\Delta V_{A\_LEA}$ | $\Delta V_{A\_LEB}$ | $\Delta V_{A\_LEC}$ |
| B | $\Delta V_{B\_LEA}$ | $\Delta V_{B\_LEB}$ | $\Delta V_{B\_LEC}$ |
| C | $\Delta V_{C\_LEA}$ | $\Delta V_{C\_LEB}$ | $\Delta V_{C\_LEC}$ |

Storing state of the left cell

| Left parameter table | A | B | C |
|---|---|---|---|
| A | $\Delta V_{A\_LEA}$ | $\Delta V_{A\_LEB}$ | $\Delta V_{A\_LEC}$ |
| B | $\Delta V_{B\_LEA}$ | $\Delta V_{B\_LEB}$ | $\Delta V_{B\_LEC}$ |
| C | $\Delta V_{C\_LEA}$ | $\Delta V_{C\_LEB}$ | $\Delta V_{C\_LEC}$ |

(Storing state of the central cell)

Storing state of the right cell

| Right parameter table | A | B | C |
|---|---|---|---|
| A | $\Delta V_{A\_REA}$ | $\Delta V_{A\_REB}$ | $\Delta V_{A\_REC}$ |
| B | $\Delta V_{B\_REA}$ | $\Delta V_{B\_REB}$ | $\Delta V_{B\_REC}$ |
| C | $\Delta V_{C\_REA}$ | $\Delta V_{C\_REB}$ | $\Delta V_{C\_REC}$ |

(Storing state of the central cell)

Storing state of the down cell

| Down parameter table | A | B | C |
|---|---|---|---|
| A | $\Delta V_{A\_DEA}$ | $\Delta V_{A\_DEB}$ | $\Delta V_{A\_DEC}$ |
| B | $\Delta V_{B\_DEA}$ | $\Delta V_{B\_DEB}$ | $\Delta V_{B\_DEC}$ |
| C | $\Delta V_{C\_DEA}$ | $\Delta V_{C\_DEB}$ | $\Delta V_{C\_DEC}$ |

(Storing state of the central cell)

FIG. 8

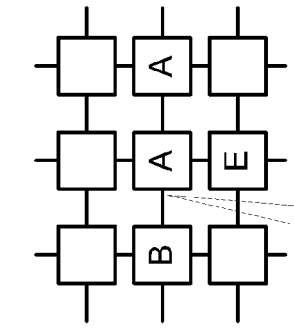
FIG. 9B  $V_{st}=0+\Delta V_{A\_REC}+\Delta V_{A\_DEA}$
FIG. 9C  $V_{st}=\Delta V_{A\_LEB}+\Delta V_{A\_REA}+0$
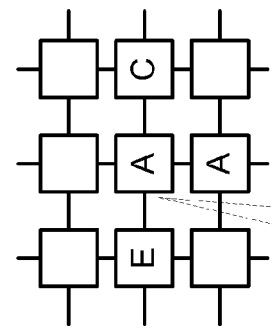
FIG. 9A  $V_{st}=\Delta V_{A\_LEA}+\Delta V_{A\_REB}+\Delta V_{A\_DEC}$
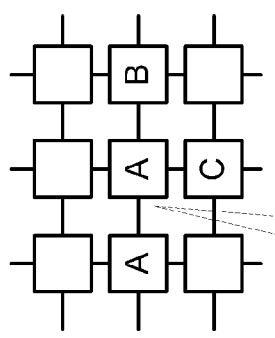
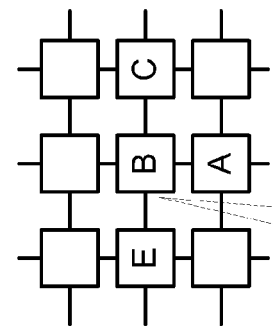
FIG. 9E  $V_{st}=0+\Delta V_{B\_REC}+\Delta V_{B\_DEA}$
FIG. 9F  $V_{st}=\Delta V_{B\_LEB}+\Delta V_{B\_REA}+0$
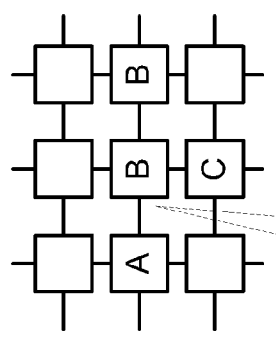
FIG. 9D  $V_{st}=\Delta V_{B\_LEA}+\Delta V_{B\_REB}+\Delta V_{B\_DEC}$
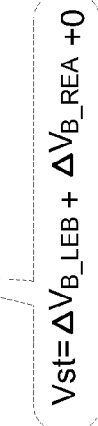

| Left/right parameter table | A | B | C |
|---|---|---|---|
| A | $\Delta V_{A\_LREA}$ | $\Delta V_{A\_LREB}$ | $\Delta V_{A\_LREC}$ |
| B | $\Delta V_{B\_LREA}$ | $\Delta V_{B\_LREB}$ | $\Delta V_{B\_LREC}$ |
| C | $\Delta V_{C\_LREA}$ | $\Delta V_{C\_LREB}$ | $\Delta V_{C\_LREC}$ |

Storing state of the left/right cell (columns); Storing state of the central cell (rows)

| Down parameter table | A | B | C |
|---|---|---|---|
| A | $\Delta V_{A\_DEA}$ | $\Delta V_{A\_DEB}$ | $\Delta V_{A\_DEC}$ |
| B | $\Delta V_{B\_DEA}$ | $\Delta V_{B\_DEB}$ | $\Delta V_{B\_DEC}$ |
| C | $\Delta V_{C\_DEA}$ | $\Delta V_{C\_DEB}$ | $\Delta V_{C\_DEC}$ |

Storing state of the down cell (columns); Storing state of the central cell (rows)

FIG. 11

GROUP CLASSIFICATION METHOD FOR SOLID STATE STORAGE DEVICE

This application claims the benefit of People's Republic of China Application Serial No. 201310137889.3, filed Apr. 19, 2013, the subject matter of which is incorporated herein by reference.

FIELD OF THE INVENTION

The present invention relates to a group classification method for a solid state storage device, and more particularly to a group classification method for a solid state storage device by classifying central cells with a specified storing state into many groups according to ICI patterns.

BACKGROUND OF THE INVENTION

As is well known, the solid state storage devices using NAND-based flash memories are widely used in a variety of electronic devices. For example, a SD card or a solid state drive (SSD) is a solid state storage device that uses a NAND-based flash memory to store data.

According to the data amount to be stored, the NAND-based flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

FIG. 1 schematically illustrates the architecture of cells of a flash memory. As shown in FIG. 1, the flash memory comprises plural cells. Each cell comprises a floating gate transistor. The flash memory is a SLC flash memory, a MLC flash memory or a TLC flash memory. Moreover, these cells of the flash memory are arranged in several columns. The cells arranged in the same column are connected with each other. Moreover, the cells arranged in the same row are connected with a corresponding word line.

Generally, the floating gate transistor of each cell has a floating gate to store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the flash memory, the threshold voltage of the floating gate transistor may be changed by controlling the amount of hot carriers to be injected into the floating gate. During a read cycle, a sensing circuit of the flash memory may judge the storing status of the floating gate transistor according to the threshold voltage of the floating gate transistor.

FIG. 2 schematically illustrates the threshold voltage distribution curves of a MLC flash memory in different storing states. Each cell of the MLC flash memory has four storing states E, A, B and C. Before the hot carriers are injected into the cell, the cell is in a storing state E (e.g. the logic state is 11). As the number of hot carriers injected into the cell is gradually increased, the cell is sequentially switched to the storing state A (e.g. the logic state is 10), the storing state B (e.g. the logic state is 00) and the storing state C (e.g. the logic state is 01). Moreover, the voltage level in the storing state C>the voltage level in the storing state B>the voltage level in the storing state A>the voltage level in the storing state E. After an erase cycle, the cell is restored to the storing state E.

In practice, even if many cells are programmed to have the same storing state during the program cycle, the threshold voltages of these cells are not all identical. That is, the threshold voltages of these cells are distributed in a specified distribution curve with a median threshold voltage. For example, as shown in FIG. 2, the cells in the storing state E have a median threshold voltage $V_{THE}$ (e.g. 0V), the cells in the storing state A have a median threshold voltage $V_{THA}$ (e.g. 10V), the cells in the storing state B have a median threshold voltage $V_{THB}$ (e.g. 20V), and the cells in the storing state C have a median threshold voltage $V_{THC}$ (e.g. 30V). For example, according to statistics, the greatest number of cells in the storing state C has the median threshold voltage $V_{THC}$ (e.g. 30V).

Consequently, during the read cycle, a first slicing voltage Vs1, a second slicing voltage Vs2 and a third slicing voltage Vs3 are provided for detecting the four storing states of the MLC flash memory.

Moreover, due to the characteristic difference between different cells, after the program cycle, the threshold voltages of some cells are possibly shifted to be higher than the predefined slicing voltage. Under this circumstance, the storing states of the cells may be erroneously judged during the read cycle.

Hereinafter, the threshold voltage distribution curves of the MLC flash memory in the storing state B and the storing state C will be illustrated in order to explain the reason why the storing states of the cells may be erroneously judged during the read cycle. As shown in FIG. 2, the threshold voltage of the area b under the distribution curve of the storing state B is higher than the third slicing voltage Vs3. If the third slicing voltage Vs3 is employed to judge the storing state, the cells of the area b are erroneously judged to be in the storing state C. Similarly, the threshold voltage of the area c under the distribution curve of the storing state C is lower than the third slicing voltage Vs3. If the third slicing voltage Vs3 is employed to judge the storing state, the cells of the area c are erroneously judged to be in the storing state B.

Since two storing states of the SLC flash memory and eight storing states of the cells of the TLC flash memory are distinguished according to the above approaches, the above situations of erroneously judging the storing states of the cells during the read cycle also exist.

From the above discussions, in the threshold voltage distribution curve of each storing state, the threshold voltages of some cells are obviously shifted. Under this circumstance, the misjudgment probability is increased, and the data error rate is also increased. Therefore, there is a need of investigating the relationships between the cells and the corresponding threshold voltage shifts in various situations in order to reduce the data error rate of the flash memory during the read cycle.

SUMMARY OF THE INVENTION

An embodiment of the present invention provides a group classification method for a solid state storage device. The solid state storage device includes a central cell and plural neighboring cells around the central cell. Each of the central cell and the plural neighboring cells is programmable into one of M storing states. Moreover, N neighboring cells of the plural neighboring cells have a significant ICI effect. The group classification method includes the following steps. Firstly, a voltage shift parameter table is established. The voltage shift parameter table includes a first positional parameter table corresponding to a first neighboring cell. The first neighboring cell is one of the N neighboring cells having the significant ICI effect. Then, $M^N$ ICI patterns are determined according to the N neighboring cells having the significant ICI effect. If the central cell has a first storing state of the M storing states, $M^N$ central cell threshold voltage shifts corresponding to the $M^N$ ICI patterns are determined according to the voltage shift parameter table. Then, the first storing state is divided into plural sub-regions according to the $M^N$ central cell threshold voltage shifts. Afterwards, the central cells corresponding to a first number of ICI patterns are classified into a first group of the first storing state. The central cell threshold voltage shifts corresponding to the first number of ICI patterns lie in a first sub-region of the first storing state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 3 schematically illustrates an ICI pattern of a MLC flash memory;

FIG. 4A is a table illustrating the relationships between 64 types of ICI patterns and the average threshold voltages ($V_{TH}$) for the central cells having the storing state A;

FIG. 4B schematically illustrates an approach of classifying the central cells having the storing state A into plural groups according to the threshold voltages corresponding to different ICI patterns;

FIGS. 5A~5E schematically illustrates a process of establishing a left parameter table for the central cells having the storing state A;

FIGS. 6A~6E schematically illustrates a process of establishing a left parameter table for the central cells having the storing state B;

FIG. 8 schematically illustrates a voltage shift parameter table according to an embodiment of the present invention;

FIGS. 9A~9C schematically illustrate an approach of estimating the voltage shifts of the central cell corresponding to three ICI patterns of the storing state A;

FIGS. 9D~9F schematically illustrate an approach of estimating the threshold voltage shifts of the central cell corresponding to three ICI patterns of the storing state B;

FIG. 11 schematically illustrates a simplified voltage shift parameter table according to an embodiment of the present invention;

DETAILED DESCRIPTION OF PREFERRED EMBODIMENTS

Figure 1:
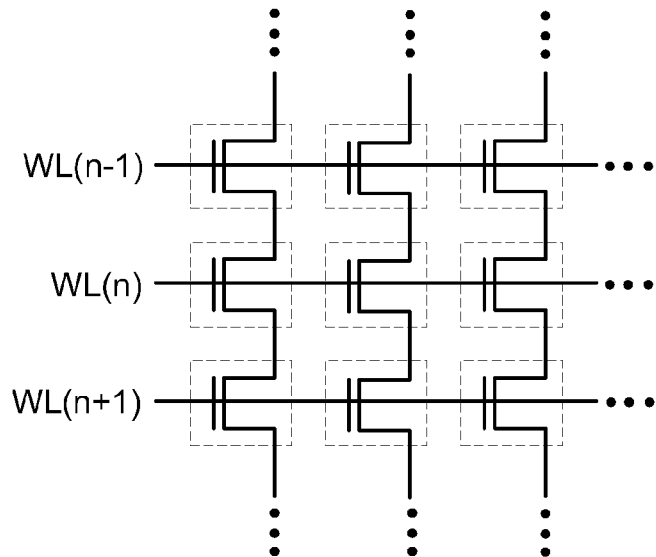
FIG. 1 (prior art) schematically illustrates the architecture of cells of a flash memory.
Figure 2:
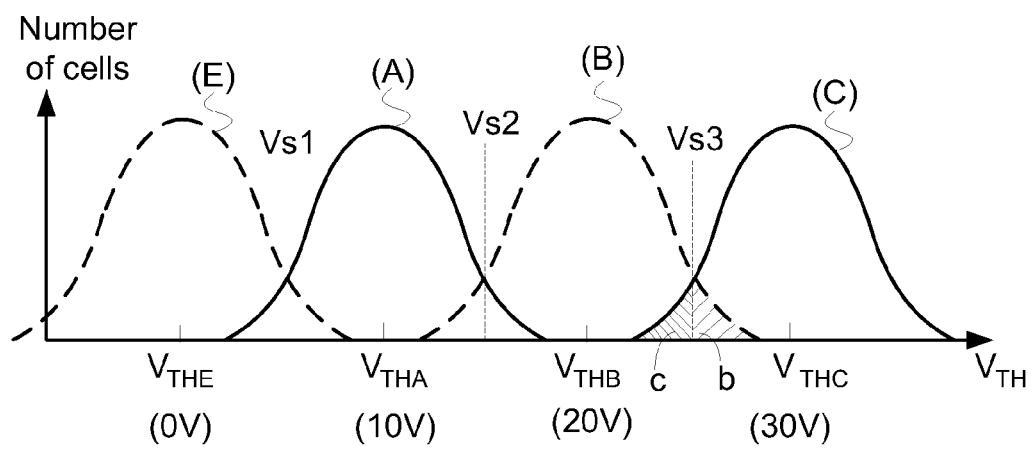
FIG. 2 (prior art) schematically illustrates the threshold voltage distribution curves of a MLC flash memory in different storing states.

In a flash memory, the threshold voltage of a central cell is usually influenced by the storing states of the neighboring cells around the central cell. The interference generated by the neighboring cells is also referred as inter-cell interference (ICI). In accordance with the present invention, the statistics about the ICI patterns of the central cells corresponding to various neighboring cells are firstly gathered, and then the statistics about the threshold voltage shifts of the central cells corresponding to different ICI patterns are gathered. Accordingly, the central cells of the flash memory are classified into plural groups.

First of all, an ICI pattern of a MLC flash memory will be illustrated with reference to FIG. 3. FIG. 3 schematically illustrates an ICI pattern of a MLC flash memory. In case that the central cell has the storing state B, the pattern of the storing states of the four cells at the up side, the down side, the left side and the right side of the central cell may be considered as an ICI pattern of the storing state B. As shown in FIG. 3, the up cell has the storing state B, the down cell has the storing state E, the left cell has the storing state A, and the right cell has the storing state C.

In FIG. 3, only one exemplary ICI pattern corresponding to the central cell with the storing state B is illustrated. In practice, each of the four cells at the up, down, left and right sides of the central cell with the storing state B have four possible storing states. That is, there are a total of 256 types of ICI patterns (i.e. 4×4×4×4=256) corresponding to the storing state B of the central cell. Similarly, there are a total of 256 types of ICI patterns corresponding to the central cell with any other storing state.

Of course, the cells to determine the ICI pattern of the central cell are not restricted to the up cell, the down cell, the left cell and the right cell. For example, the four cells at the upper left side, the upper right side, the lower left side and the lower right side of the central cell may be also included to determine the ICI pattern corresponding to the central cell. Alternatively, only some of the neighboring cells of the central cell may be employed to determine the ICI pattern corresponding to the central cell.

Generally, if the data are programmed into the flash memory in a sequence from the low word line to high word line (e.g. in the sequence of programming the word lines WL(n−1), WL(n) and WL(n+1)), the three cells at the left side, the right side and the down side of the central cell have the largest influence on the threshold voltage shift of the central cell. Consequently, the three cells at the left side, the right side and the down side of the central cell are considered as three cells having the significant ICI effect.

Consequently, the ICI pattern described in following embodiments denotes the ICI pattern of a specified central cell corresponding to the left cell, the right cell and the down cell. The configuration of the ICI pattern is presented herein for purpose of illustration and description only. When only the storing states of the three cells at the left side, the right side and the down side of the central cell are taken into consideration, there are a total of 64 types of ICI patterns (i.e. 4×4×4=256).

An easy way to realize the influences of the 64 types of ICI patterns on the threshold voltage shift of the central cell is to program a great number of known data into the flash memory. After the relationships between the threshold voltage shifts of the central cell and the corresponding ICI patterns are obtained, the table about the ICI patterns and the threshold voltages for the central cells having a specified storing state will be established.

FIG. 4A is a table illustrating the relationships between 64 types of ICI patterns and the average threshold voltages ($V_{TH}$) for the central cells having the storing state A. After a great number of known data are written into the flash memory, the threshold voltages of the central cells having the storing state A and the corresponding ICI patterns are measured. Each of the ICI patterns has an average threshold voltage of the central cells. For example, in case that the central cell has the storing state A, the average threshold voltage of the central cell corresponding to the first type ICI pattern is V1, the average threshold voltage of the central cell corresponding to the second type ICI pattern is V2. The rest may be deduced by analogy. In other words, the average threshold voltage of the central cell corresponding to the 64-th type ICI pattern is V64. Similarly, by the above approaches, the table illustrating the relationships between 64 types of ICI patterns and the average threshold voltages ($V_{TH}$) for the storing state E, the storing state B and the storing state C of the central cell can be established.

FIG. 4B schematically illustrates an approach of classifying the central cells having the storing state A into plural groups according to the threshold voltages corresponding to different ICI patterns. In the 64 types of ICI patterns of the central cells having the storing state A, the average threshold voltages corresponding to n1 ICI patterns are located at the left side of the threshold voltage distribution curve, the average threshold voltages corresponding to n2 ICI patterns are located at the middle portion of the threshold voltage distribution curve, and the average threshold voltages corresponding to n3 ICI patterns are located at the right side of the threshold voltage distribution curve. Consequently, the central cells corresponding to the n1 ICI patterns are classified into a first group A1, the central cells corresponding to the n2 ICI patterns are classified into a second group A2, and the central cells corresponding to the n3 ICI patterns are classified into a third group A3.

After the statistics about the ICI patterns and the average threshold voltages of the central cells are gathered, as shown in FIG. 4B, the central cells having the storing state A may be classified into the three groups A1, A2 and A3 according to the threshold voltages of different ICI patterns. The central cells having another storing state may be classified into many groups by the above approach. For example, the central cells having the storing state B may be classified into many groups by the above approach according to the corresponding ICI patterns. In this embodiment, the central cells having the specified storing state are classified into the three groups. Of course, the central cells having the specified storing state may be classified into two groups or more than three groups according to the practical requirements.

After the central cells having each storing state are classified into many groups, for reducing the data error rate, the slicing voltage may be adjusted during the read cycle according to the group corresponding to the ICI patterns. For example, as shown in FIG. 4B, if the second slicing voltage Vs2 is employed to judge the storing state during the read cycle, some of the central cells having the storing state A and belonging to the third group A3 may be erroneously judged to be in the storing state B. In case that the central cells to be read belong to the third group A3, the storing state may be judged again according to an updated second slicing voltage Vs2', and thus the erroneously-judged storing state B is corrected as the storing state A. In other words, during the read cycle of the flash memory, different slicing voltages may be employed to judge the storing state according to different groups in order to reduce the data error rate.

Alternatively, if a specified central cell is judged to have the storing state B during the read cycle according to the second slicing voltage Vs2, the information about the corresponding ICI pattern is also transmitted to a subsequent soft decoding unit (not shown). According to the judged storing state of the central cell and the corresponding ICI pattern, the soft decoding unit will perform an error checking and correcting (ECC) operation to reduce the data error rate.

In the approach of FIG. 4A, the central cells having a specified storing state are classified into many groups according to the threshold voltages of the central cells. Of course, the central cells having a specified storing state also can be classified into many groups according to the threshold voltage shifts of the central cells. For example, in the embodiment of FIG. 4A, the average threshold voltage V1 corresponding to the first type ICI pattern is defined as a reference threshold voltage. That is, the threshold voltage shift of the central cell corresponding to the first type ICI pattern is defined as zero. Consequently, the threshold voltage shift of the central cell corresponding to the second type ICI pattern is equal to (V2−V1); the threshold voltage shift of the central cell corresponding to the third type ICI pattern is equal to (V3−V1); and the rest may be deduced by analogy. According to the threshold voltage shifts of the central cells, the central cells having a specified storing state are classified into many groups as shown in FIG. 4B.

However, the above group classification method still has some drawbacks. For example, since the tables about the relationships between ICI patterns and threshold voltages for the central cells having four storing states should be respectively established, the above group classification method is very complicated and time-consuming.

In case that the above group classification method is applied to a TLC flash memory and the storing states of the three cells at the left side, the right side and the down side of the central cell are taken into consideration, there are a total of 512 types of ICI patterns (i.e. 8×8×8=512). Moreover, eight tables about the relationships between ICI patterns and threshold voltages, which are similar to the table of FIG. 4A, should be established. Under this circumstance, a great deal of computing resource will be consumed, and the process of classifying the threshold voltage distribution curve into many groups is time-consuming and difficult.

For solving the above drawbacks, the group classification method should be further improved. In the improved group classification method of the present invention, a voltage shift parameter table is established according to less number of ICI patterns. Through the voltage shift parameter table, the threshold voltage shifts of the central cells caused by all ICI patterns can be estimated. Consequently, the central cells having a specified storing state are classified into many groups according to the threshold voltage shifts of the central cells. The concepts of the group classification method of the present invention will be illustrated in more details as follows.

As mentioned above, the three cells at the left side, the right side and the down side of the central cell are considered as three cells having the significant ICI effect. Consequently, a voltage shift parameter table may be defined by a left parameter table, a right parameter table and a down parameter table collaboratively. The influences of all ICI patterns on the threshold voltage shifts of the central cells can be realized by looking up the voltage shift parameter table.

FIGS. 5A~5E schematically illustrates a process of establishing a left parameter table for the central cells having the storing state A. For establishing the left parameter table, the data as shown in FIGS. 5A~5D should be programmed into the flash memory. Since the cells with blank contents are not the cells having the significant ICI effect, the storing states of these cells are not restricted.

In case that the storing states of the left cell, the right cell and the down cell of the central cell having the storing state A are all the storing state E, and the threshold voltage shift of the central cell with above ICI pattern is defined as zero. That is, the left parameter table is established by using the ICI pattern of FIG. 5A as a standard while measuring the threshold voltage shift of the central cell according to different storing state of the left cell.

In comparison with the ICI pattern of FIG. 5A, the storing state of the left cell of the ICI pattern of FIG. 5B is the storing state A. The difference between the threshold voltage of the central cell corresponding to the ICI pattern of FIG. 5B and the threshold voltage of the central cell corresponding to the ICI pattern of FIG. 5A is measured and recorded as $\Delta V_{A\_LEA}$. The term $\Delta V_{A\_LEA}$ indicates the threshold voltage shift of the central cell having the storing state A caused by the difference between the storing state E and the storing state A of the left cell.

In comparison with the ICI pattern of FIG. 5A, the storing state of the left cell of the ICI pattern of FIG. 5C is the storing state B. The difference between the threshold voltage of the central cell corresponding to the ICI pattern of FIG. 5C and the threshold voltage of the central cell corresponding to the ICI pattern of FIG. 5A is measured and recorded as $\Delta V_{A\_LEB}$. The term $\Delta V_{A\_LEB}$ indicates the threshold voltage shift of the central cell having the storing state A caused by the difference between the storing state E and the storing state B of the left cell.

In comparison with the ICI pattern of FIG. 5A, the storing state of the left cell of the ICI pattern of FIG. 5D is the storing state C. The difference between the threshold voltage of the central cell corresponding to the ICI pattern of FIG. 5D and the threshold voltage of the central cell corresponding to the ICI pattern of FIG. 5A is measured and recorded as $\Delta V_{A\_LEC}$. The term $\Delta V_{A\_LEC}$ indicates the threshold voltage shift of the central cell having the storing state A caused by the difference between the storing state E and the storing state C of the left cell.

In the left parameter table as shown in FIG. 5E, the first row indicates the threshold voltage shift of the central cell having the storing state A.

FIGS. 6A~6E schematically illustrates a process of establishing a left parameter table for the central cells having the storing state B. The process of establishing the left parameter table is substantially identical to that of FIGS. 5A~5E.

In case that the storing states of the left cell, the right cell and the down cell of the central cell having the storing state B are all the storing state E, and the threshold voltage shift of the central cell with above ICI pattern is defined as zero. The difference between the threshold voltage of the central cell corresponding to the ICI pattern of FIG. 6B and the threshold voltage of the central cell corresponding to the ICI pattern of FIG. 6A is measured and recorded as $\Delta V_{B\_LEA}$. The difference between the threshold voltage of the central cell corresponding to the ICI pattern of FIG. 6C and the threshold voltage of the central cell corresponding to the ICI pattern of FIG. 6A is measured and recorded as $\Delta V_{B\_LEB}$. The difference between the threshold voltage of the central cell corresponding to the ICI pattern of FIG. 6D and the threshold voltage of the central cell corresponding to the ICI pattern of FIG. 6A is measured and recorded as $\Delta V_{B\_LEC}$. In the left parameter table as shown in FIG. 6E, the second row indicates the threshold voltage shift of the central cell having the storing state B.

FIGS. 7A~7E schematically illustrates a process of establishing a left parameter table for the central cells having the storing state C. The process of establishing the left parameter table is substantially identical to that of FIGS. 5A~5E.

Figures 7A, 7B, 7C, 7D:
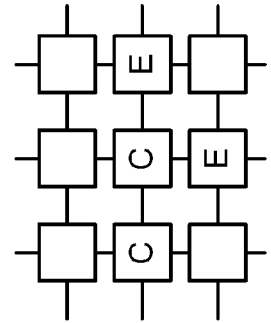
FIGS. 7A~7E schematically illustrates a process of establishing a left parameter table for the central cells having the storing state C.
Figure 7E:
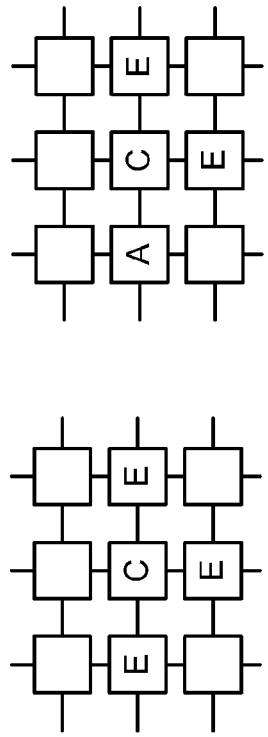

In case that the storing states of the left cell, the right cell and the down cell of the central cell having the storing state C are all the storing state E, and the threshold voltage shift of the central cell with above ICI pattern is defined as zero. The difference between the threshold voltage of the central cell corresponding to the ICI pattern of FIG. 7B and the threshold voltage of the central cell corresponding to the ICI pattern of FIG. 7A is measured and recorded as $\Delta V_{C\_LEA}$. The difference between the threshold voltage of the central cell corresponding to the ICI pattern of FIG. 7C and the threshold voltage of the central cell corresponding to the ICI pattern of FIG. 7A is measured and recorded as $\Delta V_{C\_LEB}$. The difference between the threshold voltage of the central cell corresponding to the ICI pattern of FIG. 7D and the threshold voltage of the central cell corresponding to the ICI pattern of FIG. 7A is measured and recorded as $\Delta V_{C\_LEC}$. In the left parameter table as shown in FIG. 7E, the third row indicates the threshold voltage shift of the central cell having the storing state C.

Similarly, the above processes are repeated while changing the storing state of a right cell at a time and recording the threshold voltage shift of the central cell. Consequently, a right parameter table can be established. Similarly, the above processes are repeated while changing the storing state of a down cell at a time and recording the threshold voltage shift of the central cell. Consequently, a down parameter table can be established. FIG. 8 schematically illustrates a voltage shift parameter table according to an embodiment of the present invention. The voltage shift parameter table comprises the left parameter table, the right parameter table and the down parameter table. In case that a specified cell has M storing states, each positional parameter table is associated with a neighboring cell, and is used for recording the records the central cell threshold voltage shifts corresponding to (M−1) storing states of the central cell and (M−1) storing states of the corresponding neighboring cell.

After the voltage shift parameter table as shown in FIG. 8 is established, the voltage shifts of the central cells corresponding to 64 types of ICI patterns of the central cell with various storing states can be estimated. FIGS. 9A, 9B and 9C schematically illustrate an approach of estimating the threshold voltage shifts of the central cell corresponding to three ICI patterns of the central cell with the storing state A.

In the ICI pattern as shown in FIG. 9A, the central cell has the storing state A, the left cell has the storing state A, the right cell has the storing state B, and the down cell has the storing state C. Since the central cell has the storing state A and the left cell has the storing state A, the threshold voltage shift of the central cell is $\Delta V_{A\_LEA}$ according to the first row of the left parameter table. Moreover, since the central cell has the storing state A and the right cell has the storing state B, the threshold voltage shift of the central cell is $\Delta V_{A\_REB}$ according to the first row of the right parameter table. Moreover, since the central cell has the storing state A and the down cell has the storing state C, the threshold voltage shift of the central cell is $\Delta V_{A\_DEC}$ according to the first row of the down parameter table. Consequently, the sum of the threshold voltage shifts of the central cell having the storing state A that are caused the ICI pattern of FIG. 9A may be calculated as: $Vst=\Delta V_{A\_LEA}+\Delta V_{A\_REB}+\Delta V_{A\_DEC}$.

In the ICI pattern as shown in FIG. 9B, the central cell has the storing state A, the left cell has the storing state E, the right cell has the storing state C, and the down cell has the storing state A. Since the central cell has the storing state A and the left cell has the storing state E, the threshold voltage shift of the central cell is zero. Moreover, since the central cell has the storing state A and the right cell has the storing state C, the threshold voltage shift of the central cell is $\Delta V_{A\_REC}$ according to the first row of the right parameter table. Moreover, since the central cell has the storing state A and the down cell has the storing state A, the threshold voltage shift of the central cell is $\Delta V_{A\_DEA}$ according to the first row of the down parameter table. Consequently, the sum of the threshold voltage shifts of the central cell having the storing state A that are caused the ICI pattern of FIG. 9B may be calculated as: $Vst=0+\Delta V_{A\_REC}+\Delta V_{A\_DEA}$.

In the ICI pattern as shown in FIG. 9C, the central cell has the storing state A, the left cell has the storing state B, the right cell has the storing state A, and the down cell has the storing state E. Since the central cell has the storing state A and the left cell has the storing state B, the threshold voltage shift of the central cell is $\Delta V_{A\_LEB}$ according to the first row of the left parameter table. Moreover, since the central cell has the storing state A and the right cell has the storing state A, the threshold voltage shift of the central cell is $\Delta V_{A\_REA}$ according to the first row of the right parameter table. Moreover, since the central cell has the storing state A and the down cell has the storing state E, the threshold voltage shift of the central cell is 0. Consequently, the sum of the threshold voltage shifts of the central cell that are caused the ICI pattern of FIG. 9C having the storing state A may be calculated as: $Vst=\Delta V_{A\_LEB}+\Delta V_{A\_REA}+0$.

In FIGS. 9A~9C, only the approach of estimating the threshold voltage shifts of the central cell corresponding to three ICI patterns of the storing state A is described. Similarly, the use of the voltage shift parameter table can determine the threshold voltage shift of the central cell corresponding to any ICI pattern of the storing state A. In other words, if the central cell has the storing state A, the threshold voltage shifts of the central cell caused by the 64 types of ICI patterns can be easily estimated according to the voltage shift parameter table.

Figure 9G:
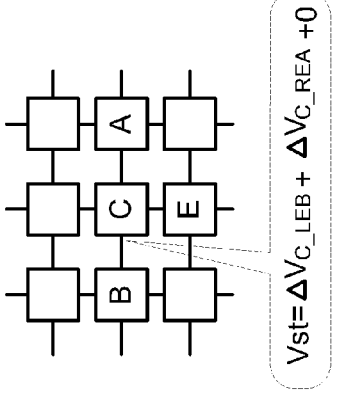
FIGS. 9G~9I schematically illustrate an approach of estimating the threshold voltage shifts of the central cell corresponding to three ICI patterns of the storing state C.
Figure 9H:
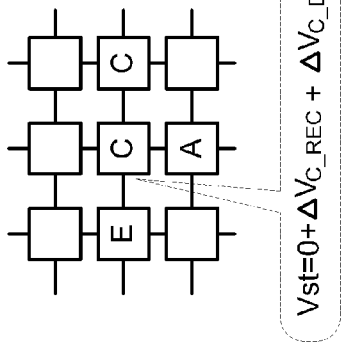
Figure 9I:
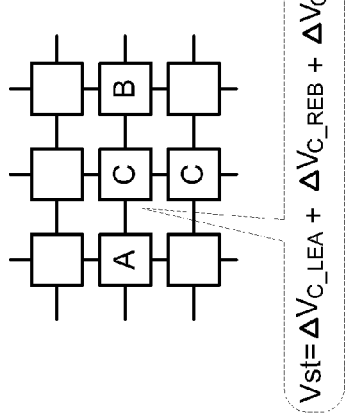

Similarly, an approach of estimating the threshold voltage shifts of the central cell corresponding to three ICI patterns of the storing state B is shown in FIGS. 9D~9F. Similarly, an approach of estimating the threshold voltage shifts of the central cell corresponding to three ICI patterns of the storing state C is shown in FIGS. 9G~9I. These approaches of FIGS. 9D~9I are similar to the approach of FIGS. 9A~9C, and are not redundantly described herein.

From the above discussions, the use of the voltage shift parameter table of FIG. 8 can estimate the threshold voltage shifts of the central cells corresponding to all ICI patterns of the storing states A, B and C. In other words, the threshold voltage shift of the central cell corresponding to a specified ICI pattern of a specified storing state is equal to the sum of the central cell threshold voltage shifts caused by respective neighboring cells of the specified ICI pattern that having the storing states listed in the voltage shift parameter table.

Hereinafter, the present invention will be illustrated by referring the central cell having the storing state A. In case that the central cell has the storing state A, the threshold voltage shifts of the central cell caused by the 64 types of ICI patterns can be easily estimated according to the voltage shift parameter table. Moreover, the central cells having the storing state A will be classified into many groups according to the threshold voltage shifts of the central cells.

For clarification and brevity, it is assumed that there are a total of 10 ICI patterns corresponding to the central cell with the storing state A. According to the voltage shift parameter table, the threshold voltage shifts of the central cell caused by the 10 types of ICI patterns are estimated and listed in the following table.

| | ICI pattern | | | | | | | | | |
|---|---|---|---|---|---|---|---|---|---|---|
| | A | B | C | D | E | F | G | H | I | J |
| Threshold voltage shift | 2 | 27 | 3 | 0 | 24 | 18 | 13 | 0 | 28 | 15 |

Then, the threshold voltage shifts are arranged in an ascending order, so that a threshold voltage shift sequence S(k) is determined. That is, the threshold voltage shift sequence S(k) is (0, 0, 2, 3, 13, 15, 18, 24, 27, 28). Moreover, a shift interval is defined as S(k)−S(k−1), which is show in the following table.

| | k | | | | | | | | | |
|---|---|---|---|---|---|---|---|---|---|---|
| | 1 | 2 | 3 | 4 | 5 | 6 | 7 | 8 | 9 | 10 |
| S(k) | 0 | 0 | 2 | 3 | 13 | 15 | 18 | 24 | 27 | 28 |
| S(k) − S(k − 1) | | 0 | 2 | 1 | 10 | 2 | 3 | 6 | 3 | 1 |
| ICI pattern | D | H | A | C | G | J | F | E | B | I |

Then, according to the magnitude of the shift interval (i.e. S(k)−S(k−1)), at least one differentiation point for dividing the storing state A into plural sub-regions is determined. For example, in the above table, the maximum shift interval "10" may be used as the differentiation point for dividing the storing state A into two sub-regions.

Consequently, among the 10 ICI patterns, the four ICI patterns (D, H, A, C) corresponding to the threshold voltage shifts in the threshold voltage shift sequence S(k) before the differentiation point "10" are classified into a first sub-region, and the central cells corresponding to these four ICI patterns are classified into a first group A1; and the six ICI patterns (G, J, F, E, B, I) corresponding to the threshold voltage shifts in the threshold voltage shift sequence S(k) after the differentiation point "10" are classified into a second sub-region, and the central cells corresponding to these six ICI patterns are classified into a second group A2.

Alternatively, in another embodiment, the maximum shift interval "10" and the second maximum shift interval "6" may be used as the differentiation points for dividing the storing state A into three sub-regions.

Consequently, among the 10 ICI patterns, the four ICI patterns (D, H, A, C) corresponding to the threshold voltage shifts in the threshold voltage shift sequence S(k) before the differentiation point "10" are classified into a first sub-region, and the central cells corresponding to these four ICI patterns are classified into a first group A1; the three ICI patterns (G, J, F) corresponding to the threshold voltage shifts in the threshold voltage shift sequence S(k) between the differentiation points "10" and "6" are classified into a second sub-region, and the central cells corresponding to these three ICI patterns are classified into a second group A2; and the three ICI patterns (E, B, I) corresponding to the threshold voltage shifts in the threshold voltage shift sequence S(k) after the differentiation point "6" are classified into a third sub-region, and the central cells corresponding to these three ICI patterns are classified into a third group A3.

From the above discussions, the threshold voltage shift sequence S(k) is determined according to the central cell threshold voltage shifts of all ICI patterns, and the shift interval is defined as S(k)−S(k−1). Then, according to the magnitude of the shift interval, at least one differentiation point for dividing the specified storing state into plural sub-regions is determined.

In other words, among the 64 ICI patterns, a1 ICI patterns corresponding to the threshold voltage shifts in the threshold voltage shift sequence S(k) before the first differentiation point are classified into a first sub-region, and the central cells corresponding to these a1 ICI patterns are classified into a first group A1; a2 ICI patterns corresponding to the threshold voltage shifts in the threshold voltage shift sequence S(k) between the first and the second differentiation points are classified into a second sub-region, and the central cells corresponding to these a2 ICI patterns are classified into a second group A2; and a3 ICI patterns corresponding to the threshold voltage shifts in the threshold voltage shift sequence S(k) after the second differentiation point are classified into a third sub-region, and the central cells corresponding to these a3 ICI patterns are classified into a third group A3.

Figure 10:
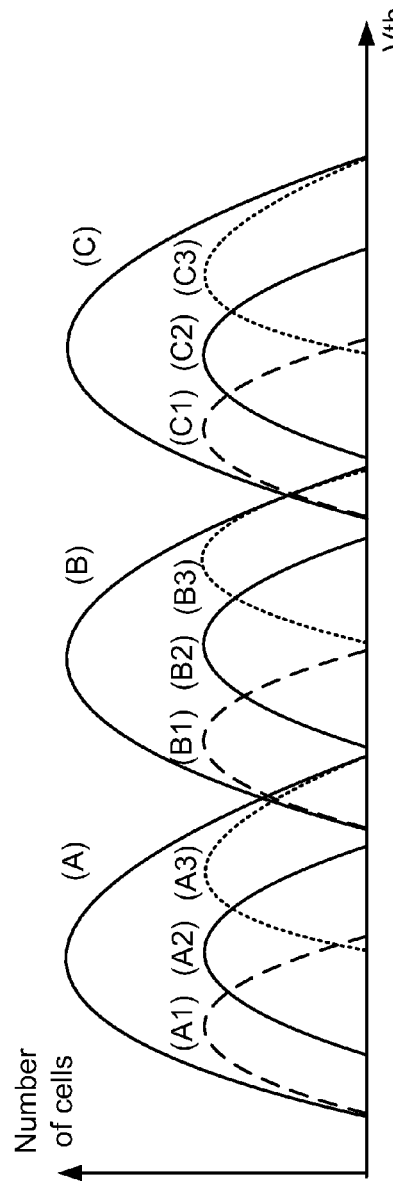
FIG. 10 schematically illustrates the use of the group classification method of the present invention to classify the storing states A, B and C into the groups A1~A3, B1~B3 and C1~C3, respectively.

Similarly, by the above method, the central cells of the storing state B may be divided into a first group B1, a second group B2 and a third group B3. Similarly, by the above method, the central cells of the storing state C may be divided into a first group C1, a second group C2 and a third group C3. Consequently, as shown in FIG. 10, the storing states A, B and C are classified into the groups A1~A3, B1~B3 and C1~C3, respectively.

In the above embodiment, the group classification method of the present invention is used to classify the central cells of a specified storing state into three groups. It is noted that the central cells of the specified storing state may be classified into two groups or more than three groups according to the practical requirements.

From the above discussions, if the central cell of the flash memory has M storing state and the N neighboring cells of the central cell have a significant ICI effect, the voltage shift parameter table only needs to store N×(M−1)×(M−1) data to estimate the central cell threshold voltage shifts caused by the $M^N$ ICI patterns of each storing state of the central cell. Moreover, according to the $M^N$ central cell threshold voltage shifts, the central cells of each storing state are classified into plural groups.

For example, in the voltage shift parameter table of FIG. 8, each cell of the MLC flash memory has four storing states (i.e. M=4). Moreover, the three cells at the left side, the right side and the down side of the central cell are considered as the cells having the significant ICI effect (i.e. N=3). Consequently, the voltage shift parameter table only needs to store 27 data (i.e. 3×3×3=27) to estimate the central cell threshold voltage shifts caused by the ICI patterns of the storing states A, B and C of the central cell. As each storing state of the central cell has 64 ICI patterns, 64 central cell threshold voltage shifts are estimated corresponding to the 64 ICI patterns. Moreover, according to the 64 central cell threshold voltage shifts for each storing state, the central cells of each storing state can be classified into plural groups.

In the above embodiments, the storing state E is used as a reference storing state. That is, the threshold voltage shift of the cell having the storing state E is defined as zero, and it is not necessary to record the threshold voltage shift about the storing state E. However, the reference storing state is not restricted to the storing state E, and any other storing state may be used as the reference storing state. For example, if the central cell has M storing states and the N neighboring cells of the central cell have a significant ICI effect, one of the M storing states may be selected as the reference storing state. Under this circumstance, the voltage shift parameter table for each neighboring cell having the significant ICI effect (e.g. the left cell) only needs to store (M−1)×(M−1) data (e.g. the left parameter table of FIG. 7E).

Moreover, in case that the left cell, the right cell and the down cell have the significant ICI effect, the contents of the left parameter table and right parameter table are very similar because the left cell and the right cell are symmetric with respect to the central cell. Consequently, in another embodiment, the voltage shift parameter table may contain the left parameter table to estimate the central cell threshold voltage shifts caused by the left cell and the right cell, but the right parameter table is not included in the voltage shift parameter table. Alternatively, in another embodiment, the voltage shift parameter table may contain the right parameter table to estimate the central cell threshold voltage shifts caused by the left cell and the right cell, but the left parameter table is not included in the voltage shift parameter table.

FIG. 11 schematically illustrates a simplified voltage shift parameter table according to an embodiment of the present invention. As shown in FIG. 11, the voltage shift parameter table comprises a left/right parameter table and a down parameter table. The left/right parameter table is the left parameter table or the right parameter table of FIG. 8. The voltage shift parameter table of FIG. 11 can be used to estimate the central cell threshold voltage shifts caused by the ICI patterns of the storing states A, B and C of the central cell. For example, in case that the central cell has the storing state A and the left cell has the storing state B, the threshold voltage shift of the central cell is $\Delta V_{A\_LREB}$. In case that the central cell has the storing state A and the right cell has the storing state B, the threshold voltage shift of the central cell is also $\Delta V_{A\_LREB}$.

After the 64 central cell threshold voltage shifts caused by the 64 ICI patterns of the storing state A of the central cell are estimated, the central cells of the storing state A can be further divided into a first group A1, a second group A2 and a third group A3. Similarly, after the 64 central cell threshold voltage shifts caused by the 64 ICI patterns of the storing state B of the central cell are estimated, the central cells of the storing state B can be further divided into a first group B1, a second group B2 and a third group B3. Similarly, after the 64 central cell threshold voltage shifts caused by the 64 ICI patterns of the storing state C of the central cell are estimated, the central cells of the storing state C can be further divided into a first group C1, a second group C2 and a third group C3.

From the above discussions, if a specified number of cells having the significant ICI effect are symmetric to each other, the number of data stored in the voltage shift parameter table may be lower than N×(M−1)×(M−1). For example, the simplified voltage shift parameter table as shown in FIG. 11 only needs to store (N−1)×(M−1)×(M−1) data (e.g. 2×3×3=18) to estimate the central cell threshold voltage shifts caused by the ICI patterns of the storing states A, B and C of the central cell. Moreover, according to the central cell threshold voltage shifts for each storing state, the central cells of each storing state can be classified into plural groups.

Figure 12:
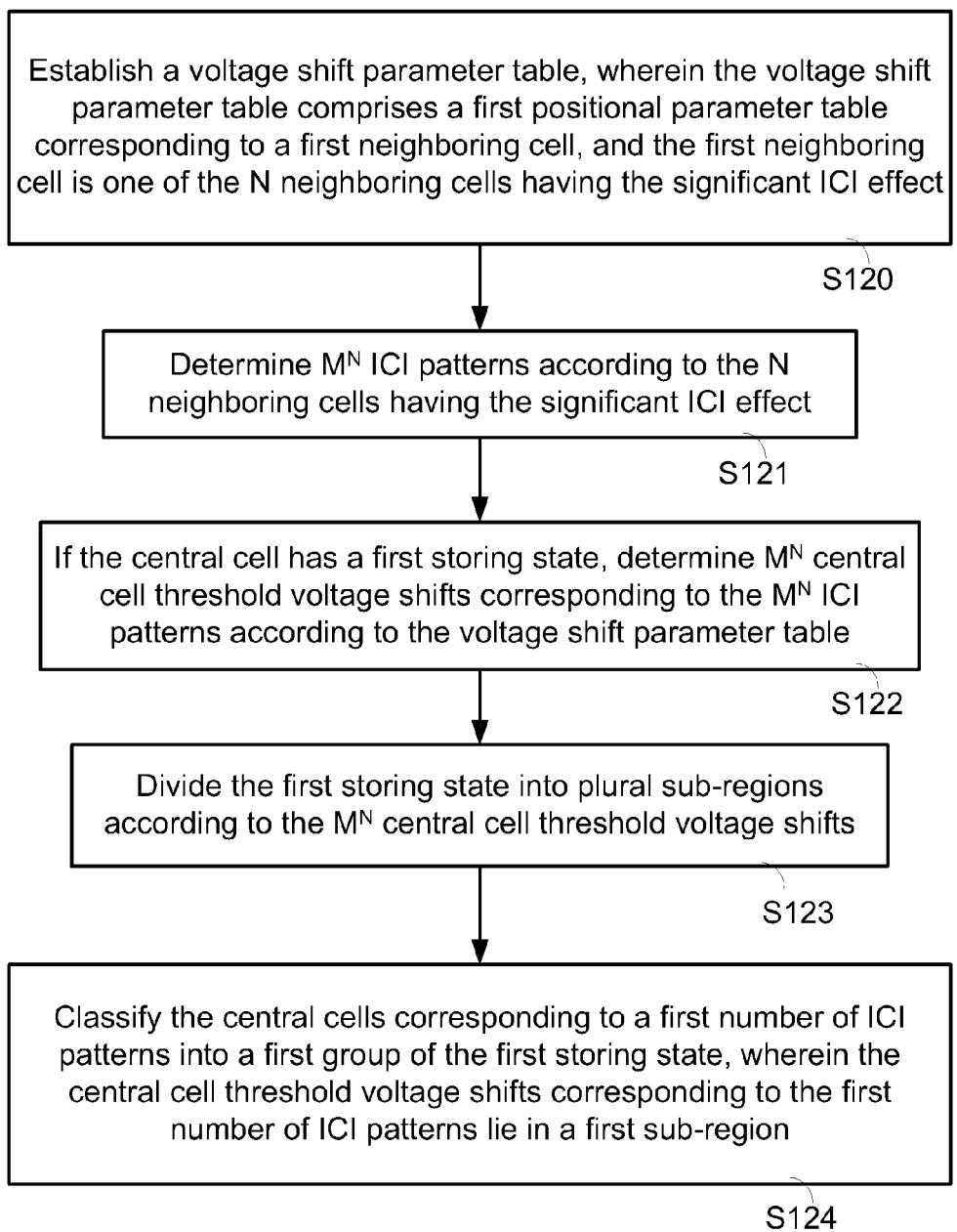
FIG. 12 is a flowchart illustrating a group classification method for a solid state storage device according to an embodiment of the present invention.

FIG. 12 is a flowchart illustrating a group classification method for a solid state storage device according to an embodiment of the present invention. The solid state storage device comprises a central cell and plural neighboring cells around the central cell. Each of the central cell and the plural neighboring cells is programmable into one of M storing states. Moreover, N neighboring cells of the plural neighboring cells have a significant ICI effect.

Firstly, in the step S120, a voltage shift parameter table is established, wherein the voltage shift parameter table comprises a first positional parameter table corresponding to a first neighboring cell, and the first neighboring cell is one of the N neighboring cells having the significant ICI effect. The first positional parameter table records the central cell threshold voltage shifts corresponding to (M−1) storing states of the central cell and (M−1) storing states of the first neighboring cell.

Then, $M^N$ ICI patterns are determined according to the N neighboring cells having the significant ICI effect (Step S121). Then, if the central cell has a first storing state, $M^N$ central cell threshold voltage shifts corresponding to the $M^N$ ICI patterns are determined according to the voltage shift parameter table (Step S122). Then, the first storing state is divided into plural sub-regions according to the $M^N$ central cell threshold voltage shifts (Step S123). The first storing state is one of the M storing states.

Then, the central cells corresponding to a first number of ICI patterns are classified into a first group of the first storing state, wherein the central cell threshold voltage shifts corresponding to the first number of ICI patterns lie in a first sub-region (Step S124).

Generally, the step S124 could be repeatedly performed many times until plural groups of the first storing state are completely classified. For example, when the step S124 is performed at the second time, the central cells corresponding to a second number of ICI patterns are classified into a second group of the first storing state, wherein the central cell threshold voltage shifts corresponding to the second number of ICI patterns lie in a second sub-region.

Moreover, in case that the central cell has other storing states, the steps S122, S123 and S124 could be repeatedly performed until plural groups of other storing states are completely classified. The procedures of these steps are not redundantly described herein.

Figure 13:
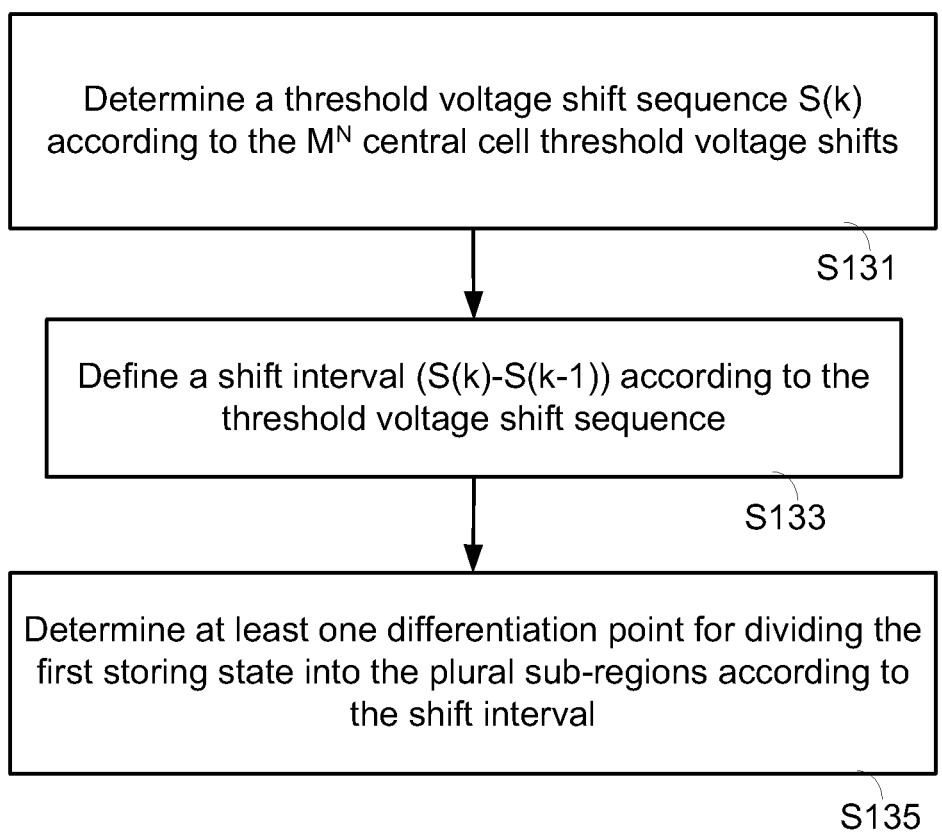
FIG. 13 is a flowchart illustrating the step of dividing the first storing state into the plural sub-regions according to the central cell threshold voltage shifts.

FIG. 13 is a flowchart illustrating the step of dividing the first storing state into the plural sub-regions according to the central cell threshold voltage shifts. In FIG. 12, the step S123 of dividing the first storing state into plural sub-regions according to the $M^N$ central cell threshold voltage shifts comprises the following sub-steps.

Firstly, a threshold voltage shift sequence is determined according to the $M^N$ central cell threshold voltage shifts (Step S131). Then, a shift interval (S(k)−S(k−1)) is determined according to the threshold voltage shift sequence (Step S133). Then, at least one differentiation point for dividing the first storing state into the plural sub-regions is determined according to the shift interval (Step S135).

From the above descriptions, the present invention provides a group classification method for a solid state storage device. By the group classification method, each storing state of the central cell of the solid state storage device is classified into plural groups. Consequently, during the read cycle, the data error rate is reduced, and the data accuracy of the solid state storage device is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A group classification method for a solid state storage device, the solid state storage device comprising a central cell and plural neighboring cells around the central cell, each of the central cell and the plural neighboring cells being programmable into one of M storing states, N neighboring cells of the plural neighboring cells having a significant ICI effect, the group classification method comprising steps of:
   establishing a voltage shift parameter table, wherein the voltage shift parameter table comprises a first positional parameter table corresponding to a first neighboring cell, and the first neighboring cell is one of the N neighboring cells having the significant ICI effect;
   determining $M^N$ ICI patterns according to the N neighboring cells having the significant ICI effect;
   if the central cell has a first storing state of the M storing states, determining $M^N$ central cell threshold voltage shifts corresponding to the $M^N$ ICI patterns according to the voltage shift parameter table;
   dividing the first storing state into plural sub-regions according to the $M^N$ central cell threshold voltage shifts; and
   classifying the central cells corresponding to a first number of ICI patterns into a first group of the first storing state, wherein the central cell threshold voltage shifts corresponding to the first number of ICI patterns lie in a first sub-region of the first storing state.

2. The group classification method as claimed in claim 1, further comprising a step of classifying the central cells corresponding to a second number of ICI patterns into a second group of the first storing state, wherein the central cell threshold voltage shifts corresponding to the second number of ICI patterns lie in a second sub-region.

3. The group classification method as claimed in claim 1, further comprising steps of:
   if the central cell has a second storing state of the M storing states, determining $M^N$ central cell threshold voltage shifts corresponding to the $M^N$ ICI patterns according to the voltage shift parameter table;
   dividing the second storing state into plural sub-regions according to the $M^N$ central cell threshold voltage shifts; and
   classifying the central cells corresponding to a second number of ICI patterns into a second group of the second storing state, wherein the central cell threshold voltage shifts corresponding to the second number of ICI patterns lie in a second sub-region of the second storing state.

4. The group classification method as claimed in claim 1, wherein the voltage shift parameter table has N×(M−1)×(M−1) data at most.

5. The group classification method as claimed in claim 1, wherein the first positional parameter table records the central cell threshold voltage shifts caused by the first neighboring cell.

6. The group classification method as claimed in claim 1, wherein the first positional parameter table records the central cell threshold voltage shifts corresponding to (M−1) storing states of the central cell and (M−1) storing states of the first neighboring cell.

7. The group classification method as claimed in claim 1, wherein N=3, and the first neighboring cell, a second neighboring cell and a third neighboring cell of the plural neighboring cells are defined as three neighboring cells having the significant ICI effect.

8. The group classification method as claimed in claim 7, wherein the first neighboring cell, the second neighboring cell and the third neighboring cell of the plural neighboring cells are a left cell, a right cell and a down cell, respectively.

9. The group classification method as claimed in claim 8, wherein the voltage shift parameter table comprises a left parameter table, a right parameter table and a down parameter table, wherein the left parameter table records the central cell threshold voltage shifts caused by the left cell of the central cell, the right parameter table records the central cell threshold voltage shifts caused by the right cell of the central cell, and the down parameter table records the central cell threshold voltage shifts caused by the down cell of the central cell.

10. The group classification method as claimed in claim 1, wherein the step of dividing the first storing state into the plural sub-regions according to the $M^N$ central cell threshold voltage shifts comprises sub-steps of:

determining a threshold voltage shift sequence according to the $M^N$ central cell threshold voltage shifts;

defining a shift interval according to the threshold voltage shift sequence; and determining at least one differentiation point for dividing the first storing state into the plural sub-regions according to the shift interval.

\* \* \* \* \*